(12) United States Patent
Ko et al.

(10) Patent No.: US 9,045,838 B2
(45) Date of Patent: Jun. 2, 2015

(54) SYSTEM AND METHOD FOR SEMICONDUCTOR WAFER PROCESSING WITH SIDE/BEVEL PROTECTION

(75) Inventors: Meng Tsung Ko, Sanchong (TW); Yung Tai Hung, Chiayi (TW); Chin Ta Su, Erlun Shiang (TW)

(73) Assignee: Macronix International Co., Ltd., Hsin-Chu (TW)

( * ) Notice: Subject to any disclaimer, the term of this patent is extended or adjusted under 35 U.S.C. 154(b) by 435 days.

(21) Appl. No.: 13/223,106

(22) Filed: Aug. 31, 2011

(65) Prior Publication Data
US 2013/0052823 A1    Feb. 28, 2013

(51) Int. Cl.
| C25D 17/00 | (2006.01) |
| C25D 7/12 | (2006.01) |
| C09D 5/44 | (2006.01) |
| C25D 5/48 | (2006.01) |
| C25D 13/04 | (2006.01) |
| C25D 13/22 | (2006.01) |
| H01L 21/288 | (2006.01) |
| H01L 21/768 | (2006.01) |

(52) U.S. Cl.
CPC .............. *C25D 7/123* (2013.01); *C09D 5/4476* (2013.01); *C25D 5/48* (2013.01); *C25D 13/04* (2013.01); *C25D 13/22* (2013.01); *H01L 21/2885* (2013.01); *H01L 21/76877* (2013.01)

(58) Field of Classification Search
CPC .......... C25D 5/48; C25D 7/123; C25D 13/72; C25D 13/04; C09D 5/4476; H01L 21/2885; H01L 21/28; H01L 21/31; H01L 21/76832; H01L 21/76834; H01L 21/022; H01L 21/02343; H01L 13/00
USPC ........................................................ 204/424
See application file for complete search history.

(56) References Cited

U.S. PATENT DOCUMENTS

| 6,309,981 | B1 | 10/2001 | Mayer et al. |
| 6,777,338 | B2 | 8/2004 | Ashjace et al. |
| 6,838,115 | B2* | 1/2005 | Kumar et al. .................... 427/58 |
| 2005/0020001 | A1 | 1/2005 | Aegerter et al. |
| 2005/0121329 | A1 | 6/2005 | Tsao et al. |
| 2005/0282371 | A1 | 12/2005 | Patton et al. |
| 2006/0137994 | A1 | 6/2006 | Basol et al. |
| 2009/0301867 | A1* | 12/2009 | Farkas et al. ................... 204/242 |
| 2010/0055924 | A1 | 3/2010 | Ganesan et al. |

* cited by examiner

*Primary Examiner* — Xiuyu Tai
(74) *Attorney, Agent, or Firm* — Alston & Bird LLP

(57) ABSTRACT

A system is provided that includes a power supply connectable to a semiconductor wafer including opposing, major front and back surfaces joined by a circumferential side, with the wafer undergoing processing including electroplating a damascene layer on the wafer. The system also includes an arrangement configured to apply a polymer coating to the side of the wafer before electroplating the damascene layer, with the system being configured to apply the polymer coating in accordance with an electrophoresis technique driven by the power supply. In this regard, the polymer coating is applied to the side but not at least a portion of the front and back surfaces of the wafer, and the polymer coating provides a barrier to formation of the damascene layer on the side of the wafer.

19 Claims, 4 Drawing Sheets

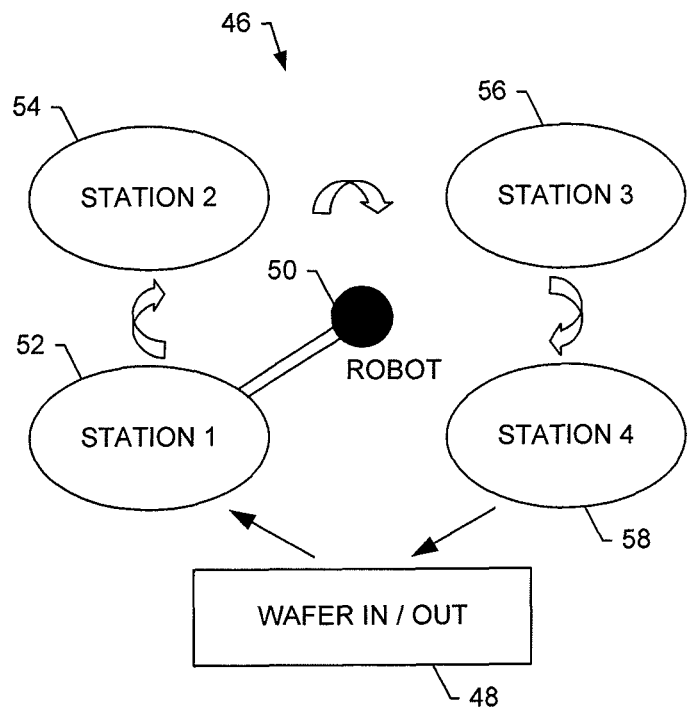
FIG. 5
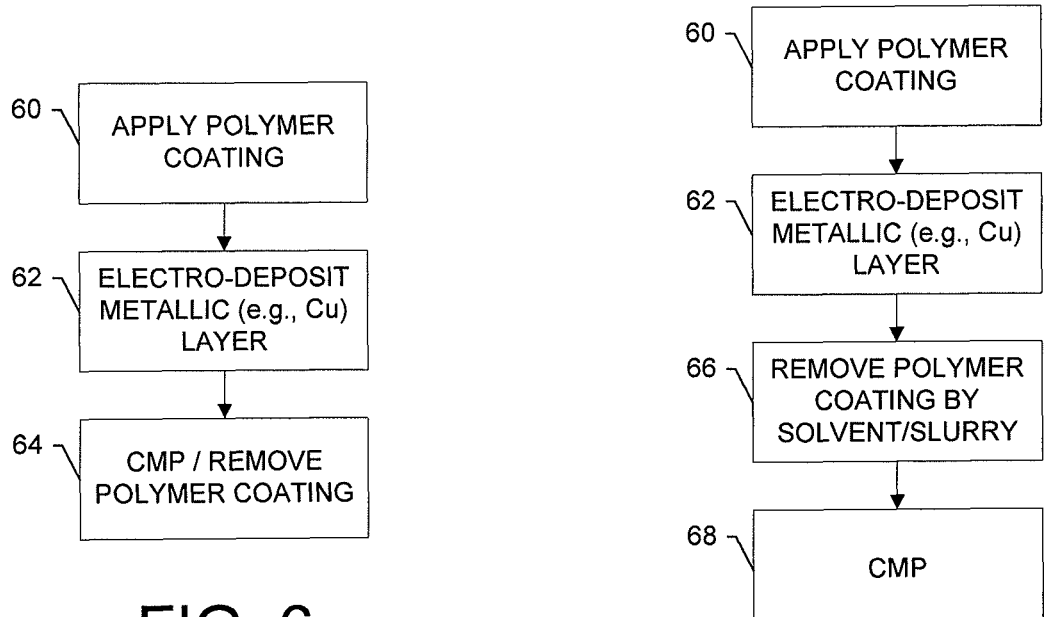
FIG. 6
FIG. 7

SYSTEM AND METHOD FOR SEMICONDUCTOR WAFER PROCESSING WITH SIDE/BEVEL PROTECTION

FIELD

Example embodiments generally relate to semiconductor wafer processing, and more particularly, relate to protection wafer side/bevel during processing.

BACKGROUND

In the semiconductor industry, fabrication of a semiconductor device generally includes processing a semiconductor wafer, which includes front-end-of-line (FEOL) and back-end-of-line (BEOL) processing during which electronic components (e.g., transistors, resistors, capacitors) are patterned in the wafer and interconnected to form integrated circuits—ICs). After processing the wafer, the wafer is broken into individual die that are then packaged.

As part of the BEOL processing, a wafer may undergo damascene processing to form electric interconnects such as conductive lines, contacts or vias. To form a conventional damascene structure, a dielectric layer is formed over a substrate having a conductive region thereon. An opening is formed in the dielectric layer. The opening can be a contact opening, a via opening, a conductive line trench or a damascene opening. The opening exposes a portion of the conductive region in the substrate. A metallic layer is formed over the substrate and completely fills the opening. In one example, this layer may be formed by first forming a thin metallic seed layer followed by a thicker metallic layer that at times may be referred to as a "damascene layer." In one example, the thin seed layer of copper may be formed by physical vapor deposition (PVD) or chemical vapor deposition (CVD), and the damascene layer of copper may be formed by electro-chemical deposition (ECD) (electroplating).

After applying metallic layer over the substrate, the wafer may be cleaned by rinsing off the wafer to remove residues generated during application of the metallic layer. The cleaned wafer may be dried such as by spinning the wafer. And finally, the wafer is annealed and chemical-mechanical polishing (CMP) is conducted to remove excess metallic material outside the opening.

One common wafer generally includes major front and back surfaces joined by a circumferential side that is often beveled. During damascene processing, it is often desirable to form the metallic filling layer such that its electrodeposited layer is close to but not on the side of the wafer. Likewise, then, it is generally undesirable for the electrodeposited layer to extend onto the side of the wafer. Techniques have been developed for removing any portion of the electrodeposited layer formed on the side of the wafer, but it is generally desirable to improve upon existing techniques.

SUMMARY

In light of the foregoing background, exemplary embodiments of the present disclosure provide an apparatus and method for wafer processing that protects the side/bevel from formation of the electrodeposited layer thereon. According to one example aspect of the present disclosure, a system is provided that includes a power supply connectable to a semiconductor wafer including opposing, major front and back surfaces joined by a circumferential side, with the wafer undergoing back-end-of-line (BEOL) processing including electroplating a damascene layer on the wafer. The system also includes an arrangement configured to apply a polymer coating to the side of the wafer before electroplating the damascene layer, with the system being configured to apply the polymer coating in accordance with an electrophoresis technique driven by the power supply. The polymer coating provides a barrier to formation of the damascene layer on the side of the wafer.

The polymer coating is more particularly applied to the side but not at least a portion of the front and back surfaces of the wafer. That is, the polymer is applied to the side and optionally some of the front and back surfaces, but not the entire front and back surfaces, of the wafer. In one example in which the front and back surfaces have a radius greater than 3-5 mm, the polymer coating may be applied to the side and the 3-5 mm of the front and back surfaces.

In one example, the arrangement includes a holder and heat source. The holder is configured to bring the wafer into contact with polymer fluid so as to coat the side of the wafer but not at least a portion of the front and back surfaces of the wafer. And the heat source is configured to thermally cure the polymer liquid coating the side of the wafer to thereby form the polymer coating.

In one example, the arrangement is configured to apply the polymer coating to the side of the wafer after formation of a metallic seed layer on the wafer and before electroplating of the damascene layer. In this example the system may further include an enclosure in which the wafer is sealable as the heat source thermally cures the polymer coating. Also in this example, the enclosure has a reducing or noble atmosphere to at least reduce oxidization of the seed layer during curing of the polymer fluid.

In one example, the arrangement further includes a bath container filled with a polymer fluid. In this example, the holder may include one or more rollers configured to hold the wafer above the bath container such that the front and back surfaces of the wafer are generally perpendicular to the plane of a top surface of the polymer fluid, and such that a portion of the side of the wafer but not at least a portion of the front and back surfaces is immersed in the polymer fluid. In this example, the roller(s) may also be configured to rotate the wafer about an axis generally perpendicular to the front and back surfaces of the wafer such that contiguous sections of the side of the wafer are immersed into and drawn out of the polymer fluid. Even further, the heat source may be configured to thermally cure the polymer liquid coating the contiguous sections of the side of the wafer as the respective contiguous sides are drawn out of the polymer fluid.

According to another example aspect of the present disclosure, an integrated plating system is provided that includes a first station configured to apply a polymer coating to a semiconductor wafer. In various examples, the first station may be the aforementioned system or include components of the aforementioned system. The integrated plating system of this example aspect also includes a second station configured to receive the wafer from the first station. The second station is configured to electroplate the damascene layer on the wafer, with the polymer coating providing a barrier to formation of the damascene layer on the side of the wafer. The integrated plating system of one example may further include an electromechanical machine configured to move the wafer from the first station to the second station.

In one example, the integrated plating system may further include a third station configured to receive the wafer from the second station, and clean and dry the wafer after the electroplating, and a fourth station configured to receive the wafer from the third station, and anneal the wafer. In this example, the electromechanical machine may be further configured to move the wafer from the second station to the third station, and from the third station to the fourth station.

BRIEF DESCRIPTION OF THE DRAWINGS

Figure 1:
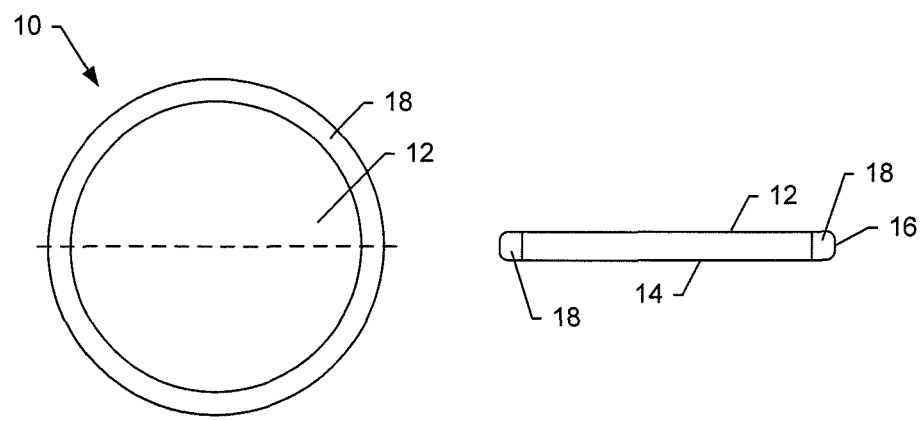
Figure 2:
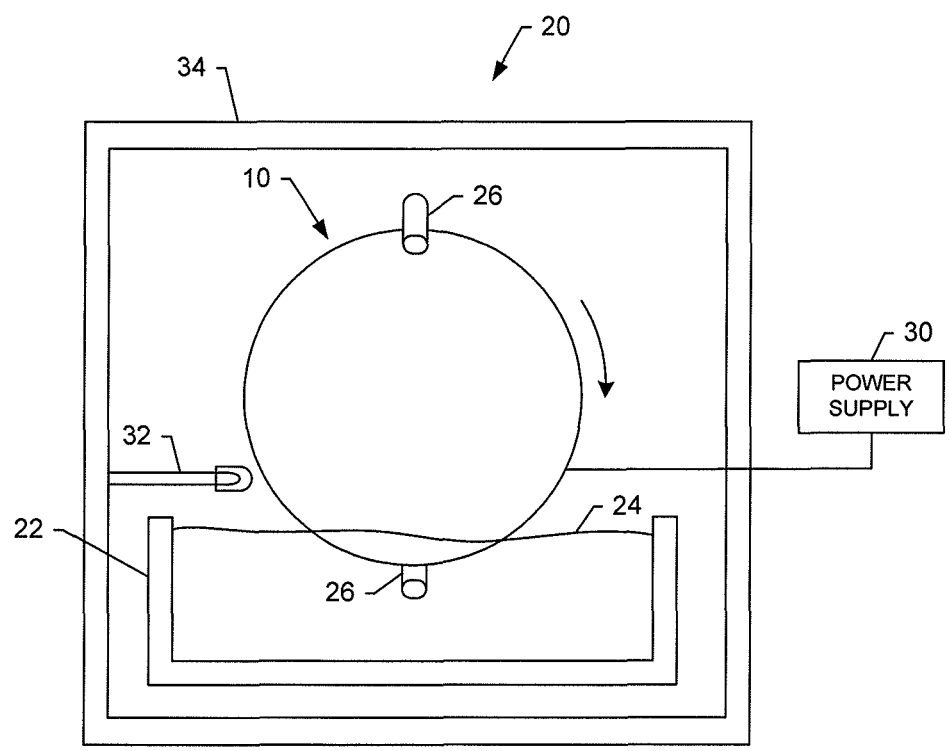
Figure 3A:
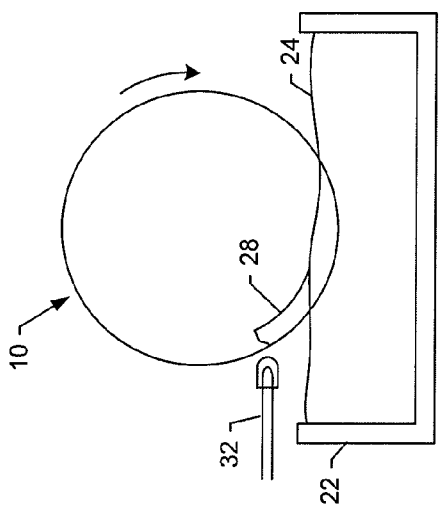
Figure 3C:
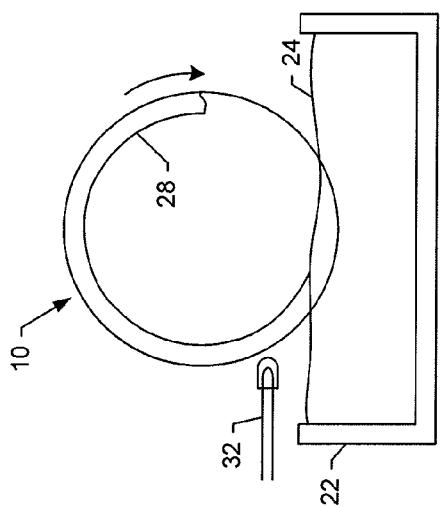
Figure 3B:
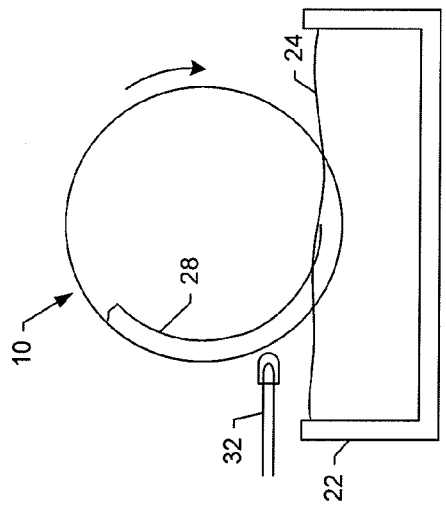
Figure 3D:
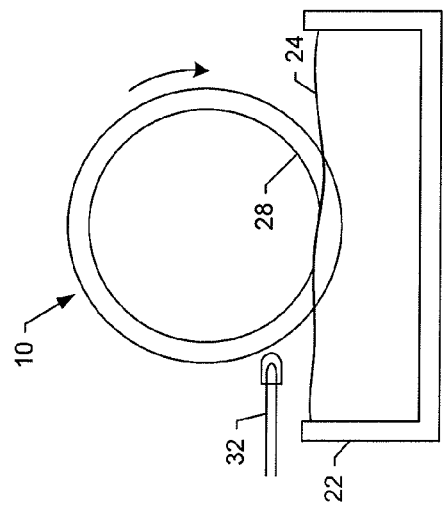
Figure 4:
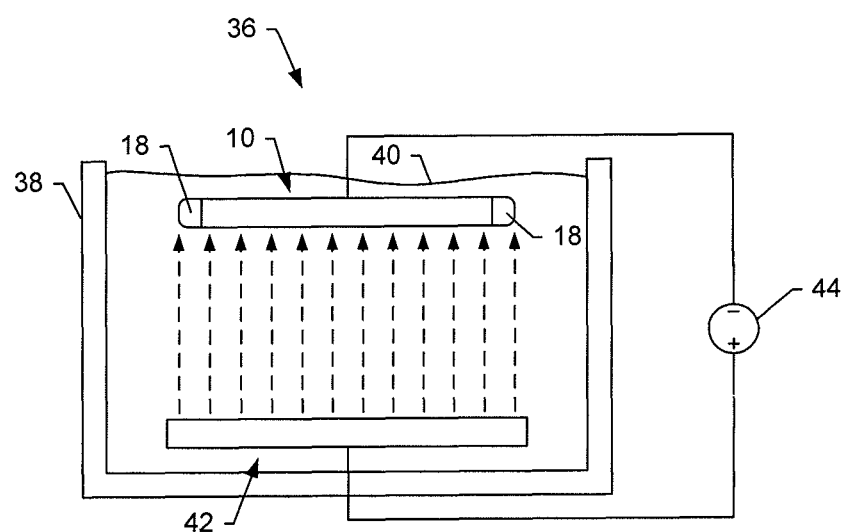

Having thus described the disclosure in general terms, reference will now be made to the accompanying drawings, which are not necessarily drawn to scale, and wherein:

FIG. 1 is a schematic top view and a cross-section view (along the dotted line) of a semiconductor wafer according to one example embodiment of the present invention;

FIG. 2 is a schematic diagram of a system for applying a polymer to a semiconductor wafer according to one example embodiment of the present invention;

FIGS. 3a-3d are schematic diagrams illustrating a portion of the system of FIG. 2 as the wafer is rotated, according to one example embodiment of the present invention;

FIG. 4 illustrates a cross-section of a system for electroplating a semiconductor wafer according to one example embodiment of the present invention;

FIG. 5 is a block diagram of an integrated plating system for performing various operations of electroplating and related processes of damascene processing of a semiconductor wafer according to one example embodiment of the present invention; and FIGS. 6 and 7 are flowcharts illustrating various operations in methods according to example embodiments of the present invention.

DETAILED DESCRIPTION

Exemplary embodiments now will be described more fully hereinafter with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Reference is made to FIG. 1, which illustrates a top view and a cross-section view (along the dotted line) of a semiconductor wafer 10 according to one example embodiment of the present invention ("example," "exemplary" and like terms as used herein refer to "serving as an example, instance or illustration"). As shown, the wafer includes opposing, major front and back surfaces 12, 14 joined by a circumferential side 16 that may or may not be beveled (beveled side being shown). The side may at times therefore be referred to as a beveled side, beveled edge, bevel or side. The wafer may be one processed in accordance with front-end-of-line (FEOL) and back-end-of-line (BEOL) processing during which electronic components (e.g., transistors, resistors, capacitors) are patterned in the wafer and interconnected to form integrated circuits ICs).

In a manner similar to that explained in the background section, as part of the BEOL processing, the wafer 10 may undergo damascene processing to form electric interconnects such as conductive lines, contacts or vias. To form the damascene structure, a dielectric layer is formed over a substrate having a conductive region thereon. An opening is formed in the dielectric layer. The opening can be a contact opening, a via opening, a conductive line trench or a damascene opening. The opening exposes a portion of the conductive region in the substrate. A metallic layer is formed over the substrate and completely fills the opening. Any of a number of suitable metals may be used for the metallic layer, but as described herein in accordance with one example, the metal used is copper or a copper alloy (generally referred to as "copper"). In one example, this layer may be formed by first forming a thin copper seed layer followed by a thicker damascene layer of copper. In one example, the thin seed layer of copper may be formed by physical vapor deposition (PVD) or chemical vapor deposition (CVD), and the damascene layer may be formed by electro-chemical deposition (ECD) (electroplating).

After applying metallic layer over the substrate, the wafer 10 may be cleaned by rinsing off the wafer to remove residues generated during application of the copper layer. The cleaned wafer may be dried such as by spinning the wafer. And finally, the wafer is annealed and chemical-mechanical polishing (CMP) is conducted to remove excess metallic material outside the opening.

As explained in the background section, it is generally undesirable for the electrodeposited layer to extend onto the side 16 of the wafer 10. In accordance with example embodiments of the present invention, then, before forming the damascene layer, a non-conductive polymer 18 may be coated or otherwise applied around the periphery of the wafer. In one example, the polymer may be applied around the periphery after forming the thin copper seed layer and before forming the damascene layer. The polymer may have one or more of a number of different characteristics such as by being plating-solvent compatible, and/or soluble in certain chemicals but generally insoluble to an electroplating bath.

The polymer 18 may cover the side 16 of the wafer 10, and may additionally cover respective annular portions of the front and back surfaces 12, 14 at the periphery of the surfaces. In a wafer including with front and back surfaces of diameter 150-450 mm, the polymer may in one example additionally cover 3-5 mm of the front and back surfaces. During formation of the damascene layer, the polymer functions as a barrier to formation of the damascene layer on the side and any polymer-covered portion of the front and back surfaces of the wafer. The polymer may then be removed before, after or during the CMP process such as by some solvent or slurry, thereby leaving the side and any previously-polymer-covered portion of the front and back surfaces free from the damascene layer.

The polymer 18 may be applied to the wafer 10 in any of a number of different manners. As shown in FIG. 2, in one example embodiment, a system 20 is provided for applying the polymer to the wafer. The system may include a bath container 22 filled with polymer fluid 24. The system may also include a holder configured to hold and bring the wafer into contact with the polymer fluid so as to coat the side 16 of the wafer 10, and may optionally annular portions of the front and back surfaces 12, 14 at the periphery of the surfaces—and without coating at least a portion of the front and back surfaces interior to the periphery. As shown, in one example, the holder may include one or more rollers 26 configured to hold the wafer above the bath container such that the front and back surfaces 12, 14 of the wafer are generally perpendicular to the plane of the top surface of the polymer fluid, and such that at least a portion of the side (if not also apportion of the front and back surfaces) is immersed in the polymer fluid. As shown, for example, the roller(s) may hold the wafer such that respective segments of the front and back surfaces of the wafer, and the portion of the side joining the respective segments, are immersed in the polymer fluid. In this example, the depth to which the wafer is immersed in the polymer fluid may be set to thereby set the width of any annular portions of the front and back surfaces to be covered by the polymer.

The roller(s) 26 may be further configured to rotate the wafer 10 about an axis generally perpendicular to the front and back surfaces 12, 14 of the wafer. As shown in FIGS. 3a-3d (showing only a portion of the system 20), as the roller(s) rotate the wafer, contiguous sections of the side 16 may be immersed into and drawn out of the polymer fluid 24. Similarly, for any annular portions of the front and back surfaces to be covered by the polymer, contiguous sections 28 of the respective annular portions may be immersed into and drawn out of the polymer fluid. As sections of the side and any annular portions of the front and back sides are immersed in the polymer fluid, the polymer fluid may coat the respective sections. In one example, the system may accomplish this in accordance with an electrophoresis technique driven by a power supply 30 connected to the wafer.

As sections of the side 16 and any annular portions of the front and back sides 12, 14 are drawn out of the polymer fluid 24, the polymer fluid coating the respective sections may be cured to form the polymer 18. In one example, the polymer may be thermally cured by a heat source such as a lamp 32 or ultraviolet-light source of the system. In an example embodiment in which the polymer 18 is applied after forming the thin copper seed layer and before forming the damascene layer, at least the wafer and typically also various components of the system may be sealed in an enclosure 34 having a reducing and/or noble atmosphere including, for example, nitrogen (N2), argon (Ar) or the like. The atmosphere of the enclosure may thereby at least reduce, if not prevent, oxidization of the seed layer during curing of the polymer fluid.

Again, the polymer 18 may be applied around the periphery of the wafer 10 before electro-deposition of the damascene layer of the damascene structure formed on the wafer. During the subsequent electro-deposition, then, the polymer 18 functions as a barrier to formation of the damascene layer on the side 16 and any polymer-covered portion of the front and back surfaces 12, 14 of the wafer.

FIG. 4 illustrates a cross-section of a system 36 for electroplating the wafer 10 of one example embodiment of the present invention. The system may include a bath container 38 filled with an electrolyte solution 40 such as acid copper sulfate. The wafer and a copper metal 42 are immersed in the solution—the wafer serving as a cathode, and the copper metal serving as an anode. The wafer cathode and copper anode are connected to a power supply 44 that creates a voltage potential between the wafer cathode and copper anode, and applies a direct current to the copper anode. The current causes the copper atoms of the copper anode to oxidize and dissolve in the solution. The potential between the wafer cathode and copper anode draws the dissolved copper atoms toward the wafer cathode. Typically, the dissolved copper atoms are reduced at the interface between the solution and the cathode such that they form a copper electroplate on the wafer cathode. But at the periphery of the wafer including the polymer 18, the polymer functions as a barrier to formation of the copper electroplate on the side 16 and any polymer-covered portion of the front and back surfaces 12, 14 of the wafer.

Referring now to FIG. 5, example embodiments of the present invention may further provide an integrated plating system 46 for performing the various operations of the electroplating and related processes of damascene processing of the wafer 10. The system may include a stage 48 for each or both inserting a wafer into the system and removing the wafer from the system. The system may also include a number of stations for performing the electroplating and related processes, and a robot 50 or other electromechanical machine for advancing or otherwise moving the wafer from the stage to a first of the stations, advancing the wafer from the first to a second and subsequent stations, and then advancing the wafer from a last of the stations to the stage.

As shown, the stations of the system 46 may include a first station 52 for applying the polymer 18 to the wafer; and in this regard, the first station may include a system such as the system 20 shown in FIG. 2. The stations may also include a second station 54 for electroplating copper onto the wafer including the polymer. This second station may include a system such as the system 36 shown in FIG. 4. Additionally, the stations may include a third station 56 that may include a clean bath and dryer equipment for cleaning and drying the wafer after the electroplating, and a fourth station 58 for annealing the wafer.

Reference is now made to FIGS. 6 and 7, which illustrate flowcharts including various operations in methods according to example embodiments of the present invention. The method may include providing a semiconductor wafer including opposing, major front and back surfaces joined by a circumferential side, with the wafer undergoing back-end-of-line (BEOL) processing including electroplating a damascene layer on the wafer. As shown at block 60, the method may include applying a polymer coating to the side of the wafer before electroplating the damascene layer, the polymer coating being applied to the side but not at least a portion of the front and back surfaces of the wafer. The polymer coating, which provides a barrier to formation of the damascene layer on the side of the wafer, is applied in accordance with an electrophoresis technique driven by a power supply.

Applying the polymer coating may include bringing the wafer into contact with polymer fluid so as to coat the side of the wafer but not at least a portion of the front and back surfaces of the wafer, and thermally curing the polymer liquid coating the side of the wafer to thereby form the polymer coating. More particularly, for example, applying the polymer coating may include holding the wafer above a bath container of the polymer fluid such that the front and back surfaces of the wafer are generally perpendicular to the plane of a top surface of the polymer fluid, and such that a portion of the side of the wafer but not at least a portion of the front and back surfaces is immersed in the polymer fluid. In this example, the wafer may be rotated about an axis generally perpendicular to the front and back surfaces of the wafer such that contiguous sections of the side of the wafer are immersed into and drawn out of the polymer fluid. Also in this example, thermally curing the polymer liquid may include thermally curing the polymer liquid coating the contiguous sections of the side of the wafer as the respective contiguous sides are drawn out of the polymer fluid.

In one example, the polymer coating is applied to the side of the wafer after formation of a metallic seed layer on the wafer and before electroplating of the damascene layer. In this example, the polymer coating may be applied in a reducing or noble atmosphere to at least reduce oxidization of the seed layer during curing of the polymer fluid.

Regardless of exactly how the polymer coating is applied, the method may include electroplating the damascene layer on the wafer after applying the polymer coating, the damascene layer covering the portion of the front and back surfaces to which the polymer coating is not applied, as shown in block 62. The method may then include removing the polymer coating after electroplating the damascene layer. The BEOL processing also includes chemical-mechanical polishing (CMP) of the wafer. As shown in block 64 of FIG. 6, then, the polymer coating may be removed by the CMP. Or as shown in block 66 of FIG. 7, the polymer coating may be removed by a solvent or slurry before the CMP, which may thereafter be performed as shown at block 68.

Many modifications and other embodiments of the invention will come to mind to one skilled in the art to which this invention pertains having the benefit of the teachings presented in the foregoing descriptions and the associated drawings. It should therefore be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A system comprising:
   a semiconductor wafer including opposing, major front and back surfaces joined by a circumferential side, the wafer undergoing processing including electroplating a damascene layer on the wafer; and
   an arrangement configured to apply a polymer coating to the side of the wafer before electroplating the damascene layer, the polymer coating being applied to the side but not at least a portion of the front and back surfaces of the wafer, the polymer coating providing a barrier to formation of the damascene layer on the side of the wafer,
   wherein the system is configured to apply the polymer coating in accordance with an electrophoresis technique,
   wherein the arrangement comprises a holder and a bath container filled with polymer fluid,
   wherein the holder comprises one or more rollers configured to rotate the wafer about an axis generally perpendicular to the front and back surfaces of the wafer, and
   wherein the one or more rollers are in direct contact with the wafer.

2. The system of claim 1, wherein the polymer coating is applied to the side and 3-5 mm of the front and back surfaces, the front and back surfaces having a radius greater than the 3-5 mm.

3. The system of claim 1, wherein the arrangement comprises:
   a heat source configured to thermally cure the polymer liquid coating the side of the wafer to thereby form the polymer coating.

4. The system of claim 3, wherein the arrangement is configured to apply the polymer coating to the side of the wafer after formation of a metallic seed layer on the wafer and before electroplating of the damascene layer, and wherein the system further comprises:
   an enclosure in which the wafer is sealable as the heat source thermally cures the polymer coating, the enclosure having a reducing or noble atmosphere to at least reduce oxidization of the seed layer during curing of the polymer fluid.

5. The system of claim 3, wherein the one or more rollers are also configured to hold the wafer above the bath container such that the front and back surfaces of the wafer are generally perpendicular to the plane of a top surface of the polymer fluid, and such that a portion of the side of the wafer but not at least a portion of the front and back surfaces is immersed in the polymer fluid.

6. The system of claim 5, wherein the heat source is configured to thermally cure the polymer liquid coating the contiguous sections of the side of the wafer as the respective contiguous sides are drawn out of the polymer fluid.

7. The system of claim 3, wherein the heat source is configured to thermally cure the polymer liquid coating the contiguous sections of the side of the wafer as the respective contiguous sides are drawn out of the polymer fluid.

8. The integrated plating system of claim 3, wherein the heat source is a heat lamp.

9. The integrated plating system of claim 3, wherein the heat source is an ultraviolet-light source.

10. An integrated plating system comprising:
    a semiconductor wafer including opposing, major front and back surfaces joined by a circumferential side;
    a first station configured to apply a polymer coating to the semiconductor wafer, the polymer coating being applied to the side of the wafer but not at least a portion of the front and back surfaces of the wafer; and
    a second station configured to receive the wafer from the first station, the second station being configured to electroplate the damascene layer on the wafer, the polymer coating providing a barrier to formation of the damascene layer on the side of the wafer,
    wherein the first station comprises a holder and a bath container filled with a polymer fluid,
    wherein the holder comprises one or more rollers configured to rotate the wafer about an axis generally perpendicular to the front and back surfaces of the wafer, and
    wherein the one or more rollers are in direct contact with the wafer.

11. The integrated plating system of claim 10, wherein the polymer coating is applied to the side and 3-5 mm of the front and back surfaces, the front and back surfaces having a radius greater than the 3-5 mm.

12. The integrated plating system of claim 10, wherein the first station comprises:
    a heat source configured to thermally cure the polymer liquid coating the side of the wafer to thereby form the polymer coating.

13. The integrated plating system of claim 12, wherein the first station is configured to apply the polymer coating to the side of the wafer after formation of a metallic seed layer on the wafer and before electroplating of the damascene layer, and wherein the first station further comprises:
    an enclosure in which the wafer is sealable as the heat source thermally cures the polymer coating, the enclosure having a reducing or noble atmosphere to at least reduce oxidization of the seed layer during curing of the polymer fluid.

14. The integrated plating system of claim 12, wherein the one or more rollers are also configured to hold the wafer above the bath container such that the front and back surfaces of the wafer are generally perpendicular to the plane of a top surface of the polymer fluid, and such that a portion of the side of the wafer but not at least a portion of the front and back surfaces is immersed in the polymer fluid.

15. The integrated plating system of claim 14, wherein the heat source is configured to thermally cure the polymer liquid coating the contiguous sections of the side of the wafer as the respective contiguous sides are drawn out of the polymer fluid.

16. The integrated plating system of claim 10 further comprising:
    a third station configured to receive the wafer from the second station, and clean and dry the wafer after the electroplating; and
    a fourth station configured to receive the wafer from the third station, and anneal the wafer.

17. The integrated plating system of claim 12, wherein the heat source is configured to thermally cure the polymer liquid coating the contiguous sections of the side of the wafer as the respective contiguous sides are drawn out of the polymer fluid.

18. The integrated plating system of claim 12, wherein the heat source is a heat lamp.

19. The integrated plating system of claim 12, wherein the heat source is an ultraviolet-light source.

* * * * *